(12) United States Patent
Chitaka

(10) Patent No.: US 10,980,150 B2
(45) Date of Patent: Apr. 13, 2021

(54) ELECTRONIC DEVICE

(71) Applicant: DENSO CORPORATION, Kariya (JP)

(72) Inventor: Hiroki Chitaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 36 days.

(21) Appl. No.: 16/566,279

(22) Filed: Sep. 10, 2019

(65) Prior Publication Data

US 2020/0008319 A1 Jan. 2, 2020

Related U.S. Application Data

(63) Continuation of application No. PCT/JP2018/010142, filed on Mar. 15, 2018.

(30) Foreign Application Priority Data

Apr. 17, 2017 (JP) .............................. JP2017-081539

(51) Int. Cl.
| | |
|---|---|
| *H05K 5/03* | (2006.01) |
| *H05K 7/14* | (2006.01) |
| *H05K 7/20* | (2006.01) |
| *B60R 16/023* | (2006.01) |

(52) U.S. Cl.
CPC ........... *H05K 7/20436* (2013.01); *H05K 5/03* (2013.01); *H05K 7/1418* (2013.01); *H05K 7/1427* (2013.01); *H05K 7/20854* (2013.01); *B60R 16/0239* (2013.01)

(58) Field of Classification Search
CPC .... H05K 7/20436; H05K 5/03; H05K 7/1418; H05K 7/1427; H05K 7/20854; H05K 7/20472; B60R 16/0239
See application file for complete search history.

(56) References Cited

U.S. PATENT DOCUMENTS

| | | | |
|---|---|---|---|
| 9,795,054 B2 * | 10/2017 | Reynov | H05K 7/20127 |
| 2008/0165508 A1 * | 7/2008 | Wang | H05K 7/1427 361/728 |
| 2012/0236521 A1 * | 9/2012 | Tamura | H01R 13/62 361/756 |
| 2012/0281361 A1 * | 11/2012 | Gunderson | H05K 7/20472 361/707 |

(Continued)

FOREIGN PATENT DOCUMENTS

| | | |
|---|---|---|
| JP | 2000244152 A | 9/2000 |
| JP | 2003229678 A | 8/2003 |
| JP | 2006086381 A | 3/2006 |

*Primary Examiner* — Abhishek M Rathod
(74) *Attorney, Agent, or Firm* — Harness, Dickey & Pierce, P.L.C.

(57) ABSTRACT

A component mounting part has a width shorter than a distance between guiderails. Backside projected parts protrude in a width direction from the component mounting part at a case-backside end. A width K2 which is a sum of a width of the component mounting part and widths of the backside projected parts is greater than a distance G1 between the guiderails. A clearance is formed between the circuit board and the heat conduction member when the backside projected parts are supported by the guiderails. A distance G3 from an insertion slot to an end of the guiderail on the case backside, is shorter than a distance K4 from an end of the circuit board on the side of the insertion slot to an end of the backside projected part on the side of the insertion slot.

7 Claims, 7 Drawing Sheets

(56) References Cited

U.S. PATENT DOCUMENTS

| | | | | |
|---|---|---|---|---|
| 2014/0144720 A1* | 5/2014 | Konno | ............... | B60R 25/102 180/287 |
| 2015/0374122 A1* | 12/2015 | Mine | ............... | H05K 7/1418 211/41.18 |
| 2016/0120044 A1* | 4/2016 | Chitaka | ............... | H05K 5/0039 361/756 |
| 2017/0339805 A1* | 11/2017 | Lassini | ............... | H05K 7/20545 |

* cited by examiner

ELECTRONIC DEVICE

CROSS REFERENCE TO RELATED APPLICATION

The present application is a continuation application of International Patent Application No. PCT/JP2018/010142 filed on Mar. 15, 2018, which designated the U.S. and claims the benefit of priority from Japanese Patent Application No. 2017-81539 filed on Apr. 17, 2017. The entire disclosures of all of the above applications are incorporated herein by reference.

TECHNICAL FIELD

The present disclosure relates to an electronic device including a case and a circuit board.

BACKGROUND

Conventionally, an electronic device has a structure in which a circuit board mounted with electronic components is housed in a case.

SUMMARY

An electronic device according to an aspect of the present disclosure comprises a mounted circuit board including a circuit board and a heat generating part mounted on the circuit board, a case including a substrate insertion slot which enables insertion of the mounted circuit board therethrough and housing the mounted circuit board, and a heat conduction member fixed in the case and in contact to a part of the mounted circuit board on which the heat generating part is mounted and made of a heat conductive material.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
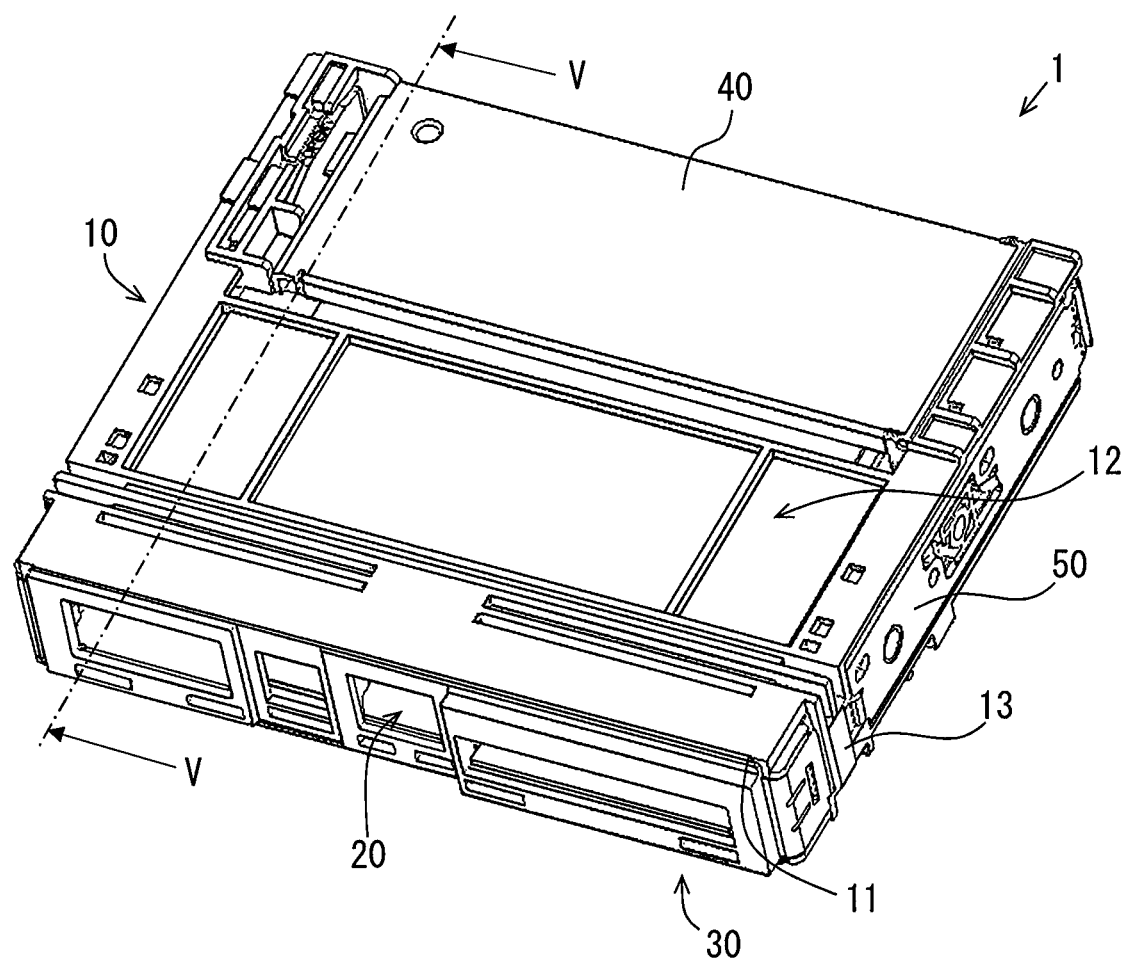
FIG. 1 is a perspective view showing an electronic device 1 according to an embodiment.

Hereinafter, one example of the present disclosure will be described.

According to the one example, an electronic device has a structure in which a circuit board mounted with electronic components is housed in a case.

In an assumable configuration, an electronic device may have a structure in which a mounted circuit board is housed in a bag-shaped case having an opening in one direction, and the opening of the case is closed with a lid. The electronic component mounted in a circuit board may include a heat generating part which requires measures for heat dissipation. An assumable measure for heat dissipation is to connect the heat generating component to a case through a thermal interface material such as a heat radiation seat, heat radiation gel or the like. A surface of the thermal interface material, which is opposite to the heat generating component, may be in contact with the case. In this configuration, a part of the case which is in contact with the thermal interface material may be made of a metal such as aluminum thereby to enable to efficiently dissipate heat of the heat generating component to the outside of the case.

In this assumable configuration, the mounted circuit board is inserted from an opening of the case. However, if the mounted circuit board is inserted from the opening of the case in a state where the heat generating component is fixed to a metallic position of the case, the following problem would occur. In the following explanation, the heat radiation seat is formed of a thermal interface material. Also, in the following explanation, the heat generating component is mounted at a position of the circuit board. The heat radiation seat is in contact with a rear side of the circuit board at the position.

When the mounted circuit board is inserted from the opening of the case in a state where the heat generating component is fixed to a metallic portion of the case, the heat radiation seat could be peeled because an end of the circuit board pushes an end surface of the heat radiation seat or scratches the heat radiation seat in the insertion process. If heat radiation seat is peeled, efficiency of heat dissipation would be decreased.

According to one aspect of the present disclosure, an electronic device comprises a mounted circuit board including a circuit board and a heat generating part mounted on the circuit board, a case including a substrate insertion slot which enables insertion of the mounted circuit board therethrough and housing the mounted circuit board, and a heat conduction member fixed in the case and in contact to a part of the mounted circuit board on which the heat generating part is mounted and made of a heat conductive material. The case includes a pair of guiderails that supports sides of the mounted circuit board, respectively, and guides the mounted circuit board backward in the case when the mounted circuit board is inserted from the circuit board insertion slot. The circuit board includes a component mounting part that has the width shorter than the distance between the pair of guiderails and on which an electronic component is mounted and a pair of backside projected parts that protrudes in a width direction from the component mounting part at case-backside ends of the circuit board, respectively. A width which is a sum of a width of the component mounting part and widths of the backside projected parts, is between a length between the pair of the guiderails, and a length which is a sum of the distance between the pair of the guiderails and the lengths of the guiderails in the width direction. The pair of guiderails has supporting surfaces, respectively, that is to support the circuit board and placed at positions such that a clearance is formed between a case-backside end of the circuit board and the heat conduction member in a direction perpendicular to the circuit board when the circuit board is supported by the supporting surfaces. A distance from the circuit board insertion slot to an end of the guiderail on the side of the case backside, is shorter than a distance from an end of the circuit board on the side of the circuit board insertion slot to an end of each of the backside projected parts on the side of the circuit board insertion slot.

In this aspect, after the mounted circuit board is inserted into the case from the circuit board insertion slot of the case, and subsequently, the backside projected parts of the mounted circuit board are placed on a pair of the guiderails, respectively, the mounted circuit board is configured to slide along the guiderail thereby to move in the back direction of the case.

The pair of guiderails has supporting surfaces, respectively, that is to support the mounted circuit board and placed at positions such that the clearance is formed between the case-backside end of the circuit board and the heat conduction member in the direction perpendicular to the circuit board when the circuit board is supported by the supporting surfaces. Therefore, this configuration restrains the case-backside end of the circuit board from pushing the side of the heat condition member, when the mounted circuit board is slid.

The distance from the circuit board insertion slot to the end of the guiderail on the side of the case backside, is shorter than the distance from the end of the circuit board on the side of the circuit board insertion slot to the end of each of the backside projected parts on the side of the circuit board insertion slot. Therefore, in a state where the mounted circuit board is slid to a position at which the mounted circuit board is housed in the case, the guiderail is caused not to support the backside projected parts of the circuit board. Also, the guiderails do not support the component mounting part of the circuit board, because the width of the component mounting part of the circuit board is shorter than the distance between the pair of the guiderails.

Therefore, in the case where the heat generating part is located lower than the supporting surface of the guiderail, the mounted circuit board is moved downward by gravity and is contacted to the heat conduction member when the guiderails do not support the backside projected parts of the circuit board.

Therefore, reduction in the heat dissipation can be restrained by causing the part of the mounted circuit board in which the heat generating part is mounted to make contact to the heat conduction member.

In this way, the aspect of the present disclosure could restrain a decrease in efficiency of heat dissipation of the electronic device.

An embodiment will be described with reference to drawings as follows. FIG. 1 is a perspective view showing an electronic device 1 according to the embodiment. The electronic device 1 is device for wireless communication and anchored on a prescribed place in a vehicle.

The electronic device 1 includes a case 10 which is made of a resin. The case 10 has a cuboid form and houses a mounted circuit board 20. The case 10 includes a circuit board insertion slot 11 which enables insertion of the mounted circuit board 20 into the case 10 therethrough. The circuit board insertion slot 11 is provided on one side of the case 10. An insertion slot lid 30 is attached to the circuit board insertion slot 11.

The case 10 is further equipped with a battery cover 40. For convenience of explanation, a surface on which the battery cover 40 is placed is referred to as an upper surface 12. However, under an actual fixed condition, the upper surface 12 is not required to be placed on upper side.

A metal plate 50 for screws is anchored to a lateral side 13 of the case 10. The lateral side 13 intersects with a side in which the circuit board insertion slot 11 is located. While FIG. 1 shows only the lateral side 13 on one side, another metal plate 50 is also anchored to another lateral side 13 on the other side which is opposite to the lateral side 13 which is shown in FIG. 1.

Figure 2:
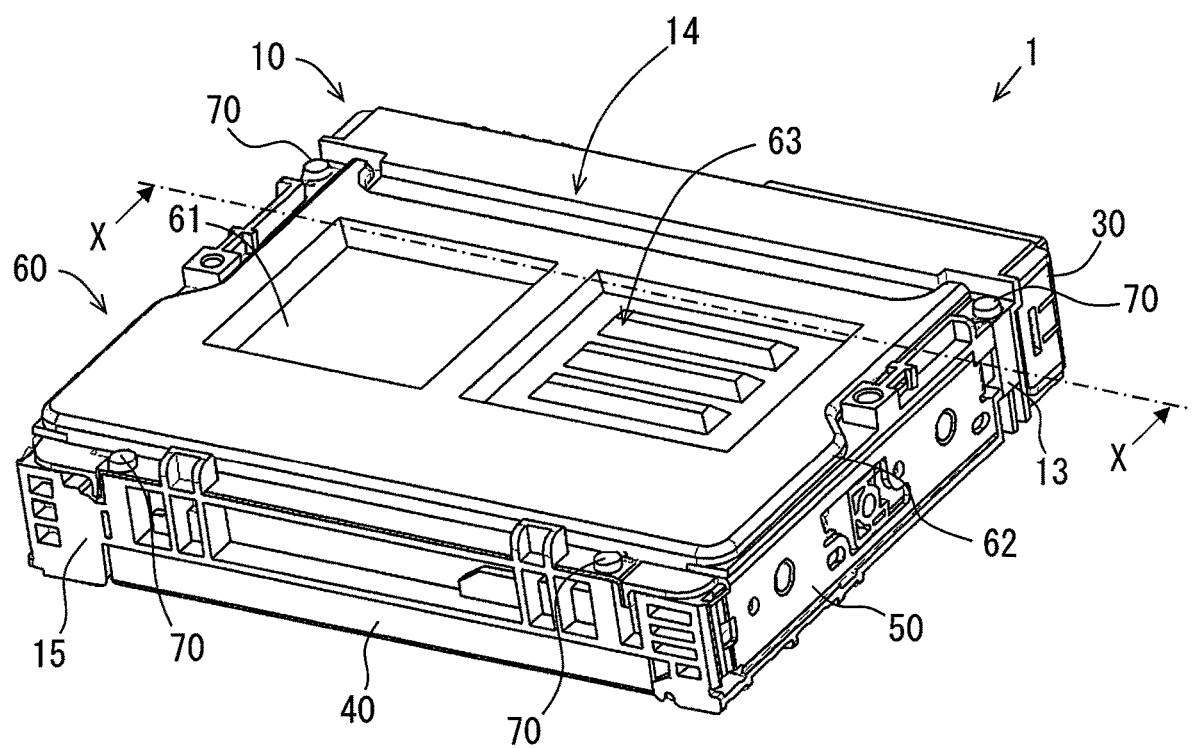
FIG. 2 is a perspective view showing an appearance of the electronic device 1 viewed from a lower surface 14.

FIG. 2 is a perspective view showing an appearance of the electronic device 1 viewed from a lower surface 14. The lower surface 14 is opposite to the upper surface 12 and parallels the upper surface 12. A back surface 15 is provided on the opposite side to the circuit board insertion slot 11. The electronic device 1 includes the circuit board insertion slot 11 which is located lower than the back surface 15, and the upper surface 12 and the lower surface 14 are anchored with equal to or over 5 degrees slopes.

Figure 4:
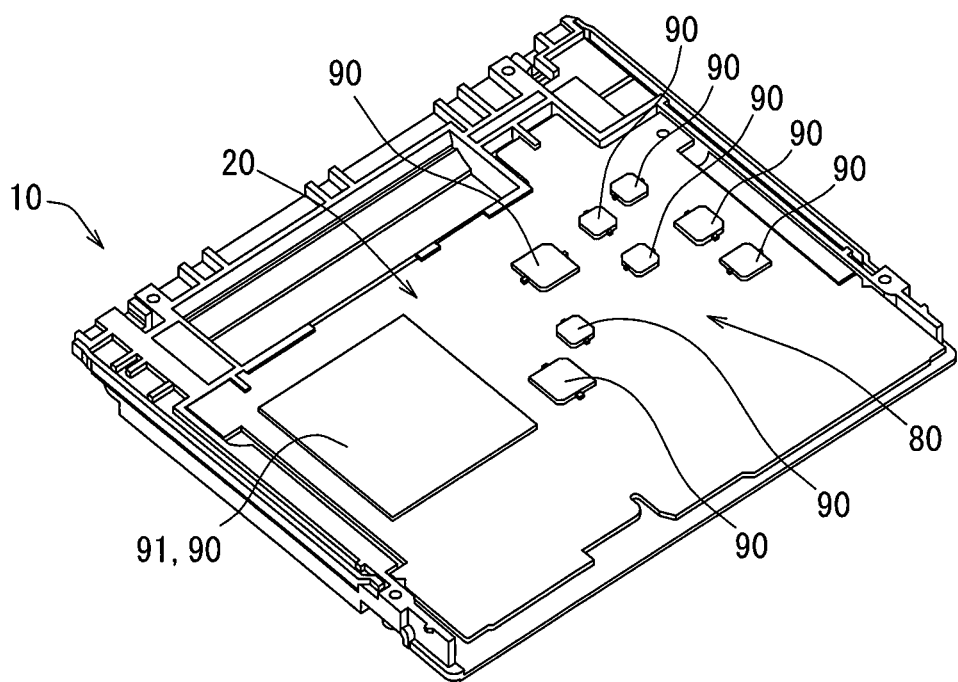
FIG. 4 is a perspective view showing a mounted circuit board 20.

A radiation lid 60 is anchored to the lower surface 14 of the case 10 by a screw 70. The radiation lid 60 is made of a metal such as aluminum. The radiation lid 60 is fixed to the case 10. One of the purposes is to dissipate heat which is generated from a heat generating part 91 in the case 10, as shown in FIG. 4. A frustum 61 with square pyramid shape is provided in the radiation lid 60 and protrudes toward the inside of the case 10.

Figure 3:
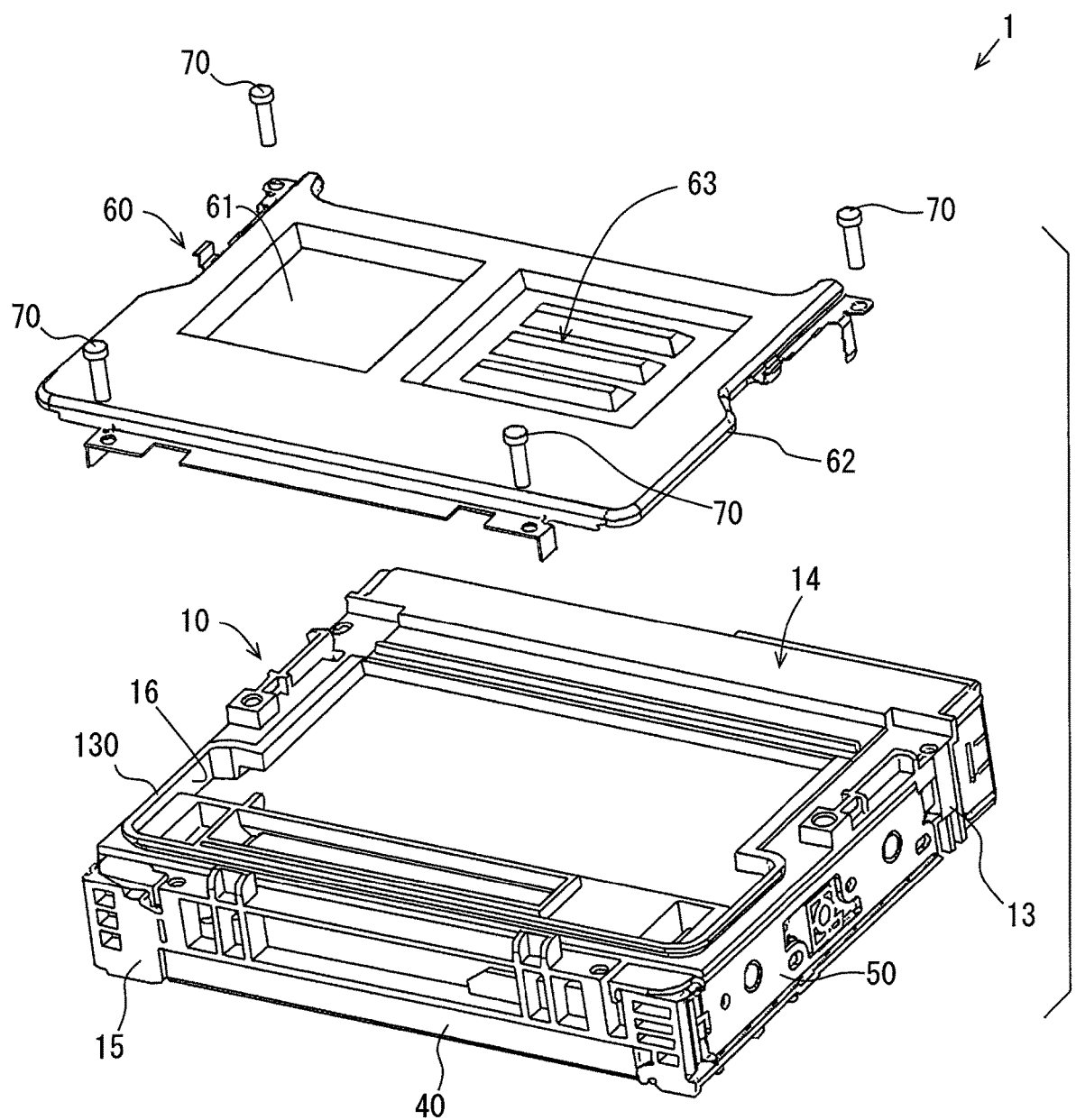
FIG. 3 is a perspective view showing a state where a radiation lid 60 is removed from the case 10.

FIG. 3 is a perspective view showing a state where a radiation lid 60 is removed from the case 10. As shown in FIG. 3, an opening 16 is provided in the lower surface 14 of the case 10. In a state where the radiation lid 60 is fixed to the lower surface 14 of the case 10, the opening 16 is closed by the radiation lid 60. Therefore, the radiation lid 60 is configured to restrain water from entering into the case 10 through the opening 16, when water adheres to the outer surface of the electronic device 1.

A drawn portion 62 is formed on the periphery of the radiation lid 60 to promote a function to restrain water from entering into the case 10. A radiation lid main part 63 is a part of the radiation lid 60 except for the periphery. The frustum 61 is formed in the radiation lid main part 63.

The drawn part 62 which is formed by a drawing work is connected to the radiation lid main part 63 and has a loop form. The drawn part 62 is connected to the case 10 around the opening 16 and surrounds the opening 16. The drawn part 62 corresponds to a radiator peripheral edge part.

Figure 11:
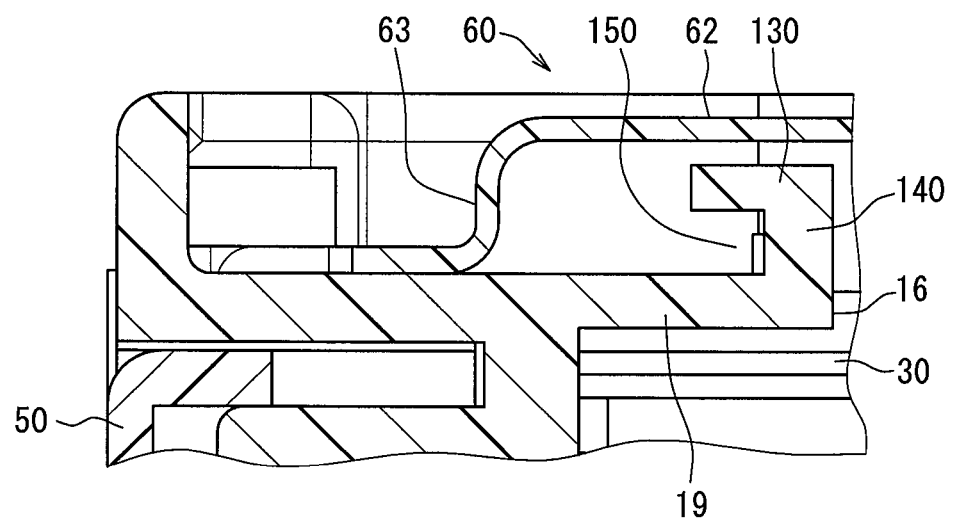
FIG. 11 is an enlarged view showing a part of FIG. 10.

A flange 130 is provided around the opening 16. The flange 130 is a part defining a water passage 150, as shown in FIG. 11, which is provided to restrain water from entering into the opening 16. Structures of the flange 130 and the water passage 150 will be described below.

FIG. 4 shows the mounted circuit board 20. FIG. 4 is a cross sectional view showing the case 10 and taken along a cross section parallel with the upper surface 12 and the lower surface 14. The mounted circuit board 20 mounts electronic components 90 on the circuit board 80. The electronic components 90 include the heat generating part 91. The heat generating part 91 in the present embodiment is a module component, in which a heater element and other circuit elements are placed, covered by a shield cover for noise countermeasure. The heat generating part 91 is not required to be the module component and may be made of one element.

Figure 5:
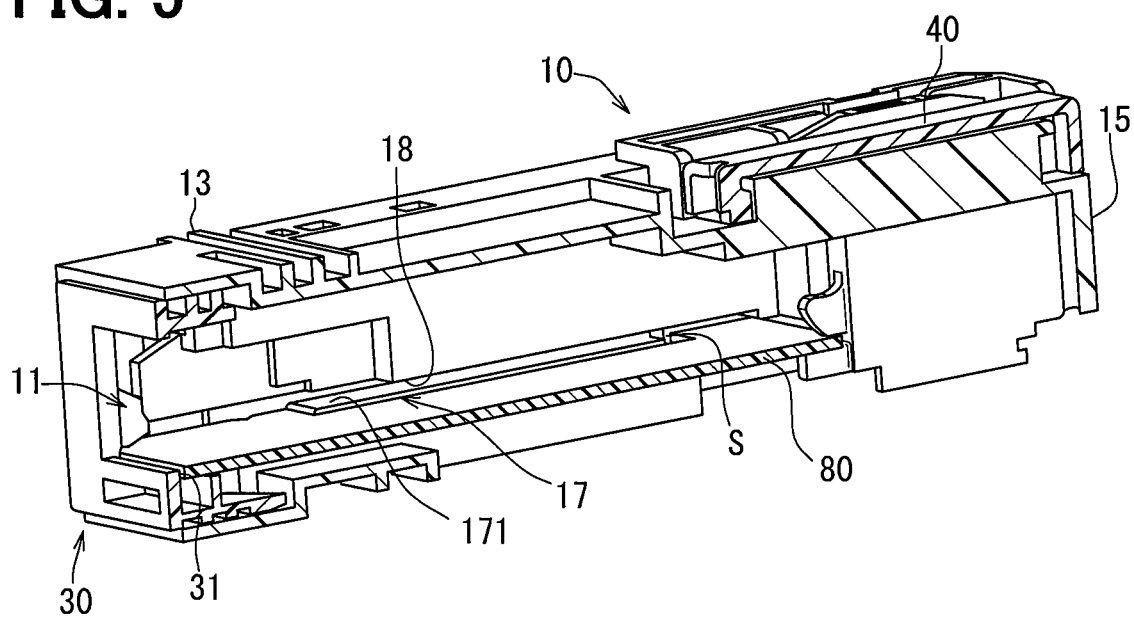
FIG. 5 is a sectional view taken along a line V-V of FIG. 1.

FIG. 5 is a sectional view taken along a line V-V in FIG. 1. As shown in FIG. 5, the case 10 includes a guiderail 17 on the inside of a lateral side 13. The guiderail 17 is formed by sliding a metallic die from the circuit board insertion slot 11. An end of the guiderail 17 on the opposite side of the circuit board insertion slot 11, which is referred to as case backside hereinafter, does not extend to the back surface 15 in the case 10. A space S is formed between a case-backside end of the guiderail 17 and the back surface 15 in the case 10. The space S is formed by a molding die which is to form the opening 16.

A supporting surface 171 of the guiderail 17 supports a rear side of the circuit board 80 when the mounted circuit board 20 is inserted into the case 10 from the circuit board insertion slot 11 of the case 10. The rear side of the circuit board 80 is a surface opposite to the side on which the heat generating part 91 is mounted.

A separation restriction surface 18 is a surface which is opposed to the supporting surface 171 and regulates an amount of movement of the circuit board 80 in a direction in which the circuit board 80 being placed on the supporting surface 171 separates from the guiderail 17, that is, in a vertical direction to the circuit board 80. A length between the supporting surface 171 and the separate restriction surface 18 is a slightly longer than a thickness of the circuit board 80.

Figure 6:
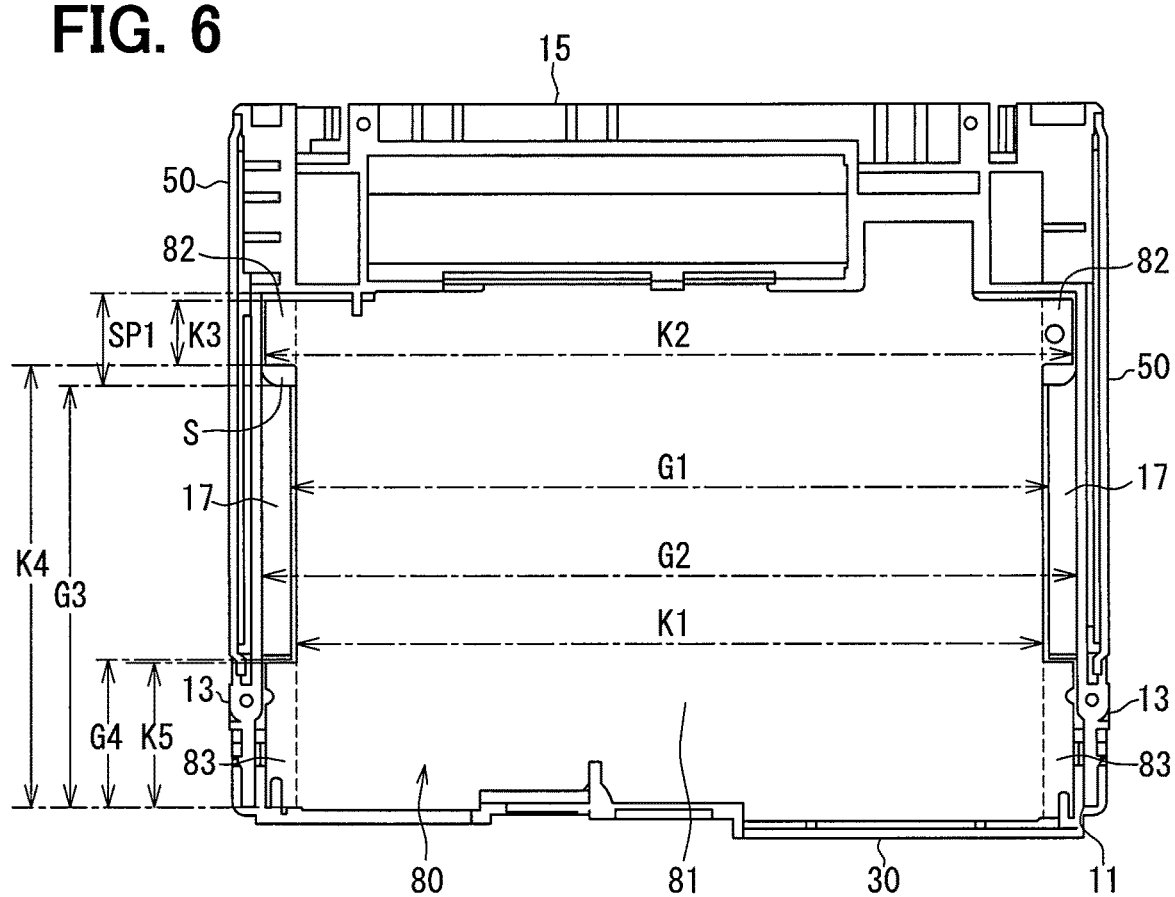
FIG. 6 is a view showing the circuit board 80 viewed from a rear side.

FIG. 5 shows only one of the guiderails 17. As shown in FIG. 6, the guiderails 17 are provided on the insides of a pair of the lateral side 13, respectively. That is, a pair of the guiderails 17 is formed. Correspondingly, a pair of the separate restriction surfaces 18 is also formed.

The insertion slot lid 30 includes a pressing part 31. The pressing part 31 when connected to the case 10 presses a surface of the circuit board 80 on the side of the circuit board insertion slot 11 toward the case backside. The pressing part 31 may be provided on another position of the insertion slot lid 30 instead of the position shown in FIG. 5, or in addition to the position shown in FIG. 5.

FIG. 6 is a view showing a form of the circuit board 80 viewed from the rear side. In FIG. 6, a detail structure of the rear side of the circuit board 80 is omitted, because FIG. 6 is a view to explain a contour shape of the circuit board 80. The circuit board 80 includes a component mounting part 81, a pair of backside projected parts 82, 82, and a pair of opening projected parts 83, 83.

The component mounting part 81 is a part on which the electronic components 90 are mounted. More specifically, a width of the component mounting part 81 in a width direction is in a range of a distance between a pair of guiderails 17 and 17 in a state where the circuit board 80 is housed in the case 10. That is, the width of the component mounting part 81 is shorter than the distance between a pair of the guiderails 17. In FIG. 6, the component mounting part 81 is a part between two broken lines in the circuit board 80. The width direction corresponds to a direction perpendicular to the guiderail 17. In FIG. 6, the width of the component mounting part 81 in the width direction is shown by K1.

The backside projected part 82 protrudes in the width direction from the component mounting part 81 in the case-backside end of the circuit board 80. A length by which the backside projected part 82 protrudes from the component mounting part 81 is described below. K2 is a length which is calculated by adding a length of the component mounting part 81 to lengths by each of which the backside projected part 82 protrudes from the component mounting part 81 in width direction. K2 is longer than G1, which is a distance between the pair of the guiderails 17 and 17, and shorter than G2 which is a length calculated by adding G1 to the lengths of the guiderails 17 in width direction. A relationship of the lengths K1, K2, G1, G2 is described as K1<G1<K2<G2. Because of the relationship of G1<K2<G2, the guiderail 17 supports the backside projected part 82. On the other hand, because of the relationship of K1<G1, the guiderail 17 does not support the component mounting part 81.

K3 is a length of the backside projected part 82 in a direction of a circuit board insertion in which the circuit board is inserted. K3 is shorter than SP1 which is a length of a space S in the direction of the circuit board insertion. The space S is placed closer to the back surface 15 than a case-backside end of the guiderail 17.

G3 is a distance from the circuit board insertion slot 11 to an end of the guiderail 17 on the side of the case-backside end. G3 is shorter than K4 which is a distance from an end of the circuit board 80 on the side of the circuit board insertion slot to an end of the backside projected part 82 on the side of the circuit board insertion slot 11.

The opening projected part 83 protrudes from the component mounting part 81 in the width direction at the case opening side of the circuit board 80. A length by which the opening projected part 83 protrudes from the component mounting part 81 is equal to the length by which the backside projected part 82 protrudes from the component mounting part 81 in the width direction.

K5 is a length of the opening projected part 83 in the circuit board insertion direction, that is, a length of the opening projected part 83 along the direction of the guiderail 17. K5 is shorter than G4 which is a distance from the end of the circuit board 8 on the side of the circuit board insertion slot 11 to the end of the guiderail 17 on the side of the circuit board insertion slot 11. G4 is almost equals to a distance from the circuit board insertion slot 11 to the end of the guiderail 17 on the side of the circuit board insertion slot.

Figure 7:
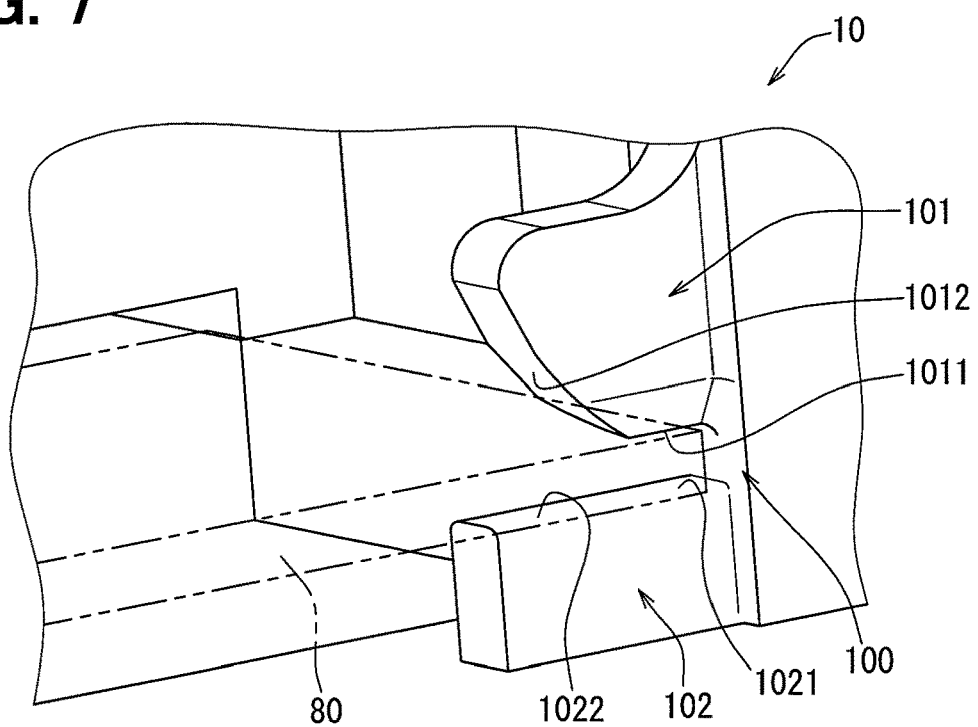
FIG. 7 is an enlarged view showing a part of FIG. 5

FIG. 7 is an enlarged view showing a part of the circuit board 80 around the one end of the circuit board 80 on the backside in FIG. 5. As shown in FIG. 7, a pinching part 100 is formed in the case 10 and pinches the case-backside end of the circuit board 80 in a state where the circuit board 80 is housed in the case 10. The pinching part 100 includes a part of a surface rib 101 which is contacted to a surface of the circuit board 80 and a part of a backside rib 102 which is brought into contact to a backside of the circuit board 80.

More specifically, the pinching part 100 includes a facing surface 1011 of the surface rib 101, which faces to and parallels to the backside rib 102, and a facing surface 1021 which faces to the facing surface 1011 of the surface rib 101 at the backside rib 102.

The distance between the facing surface 1011 of the surface rib 101 and the facing surface 1021 of the backside rib 102 is a slightly shorter than the thickness of the circuit board 80. Therefore, the end of the backside of the circuit board 80 is pressed by the pinching part 100. When the facing surfaces 1011 and 1021 press the circuit board 80, the facing surfaces 1011 and 1021 are contacted to the front side and the rear side of the circuit board 80, respectively. The facing surface 1011 and 1021 correspond to contact portions.

The surface rib 101 includes a slope 1012 which continually extends from the facing surface 1011 and faces the circuit board insertion slot 11. The slope 1012 is inclined such that the further the slope 1012 is closer to the upper side of FIG. 7, that is, the further the slope 1012 is closer to the opposite side of the backside rib 102, the further the slope 1012 is closer to the circuit board insertion slot 11. The slope 1012 is configured to be abutted to a backside end surface of the circuit board 80 and to move the circuit board 80 to the lower side in FIG. 7 by the inclination of the slope 1012.

On the other hand, the backside rib 102 includes the circuit board positioning base level 1022 which is the same surface as the facing surface 1021 and extends in a direction along the circuit board insertion slot 11. The circuit board 80 which has moved to a position on the lower side in FIG. 7 along the slope 1012 is brought into contact with the circuit board positioning base level 1022 and is unable to move downward in FIG. 7. In this way, the vertical position of the circuit board 80 is fixed. That is, the circuit board positioning base level 1022 is configured to fix the vertical position of the circuit board 80. The circuit board positioning base level 1022 corresponds to a circuit board positioning base part.

Figure 8:
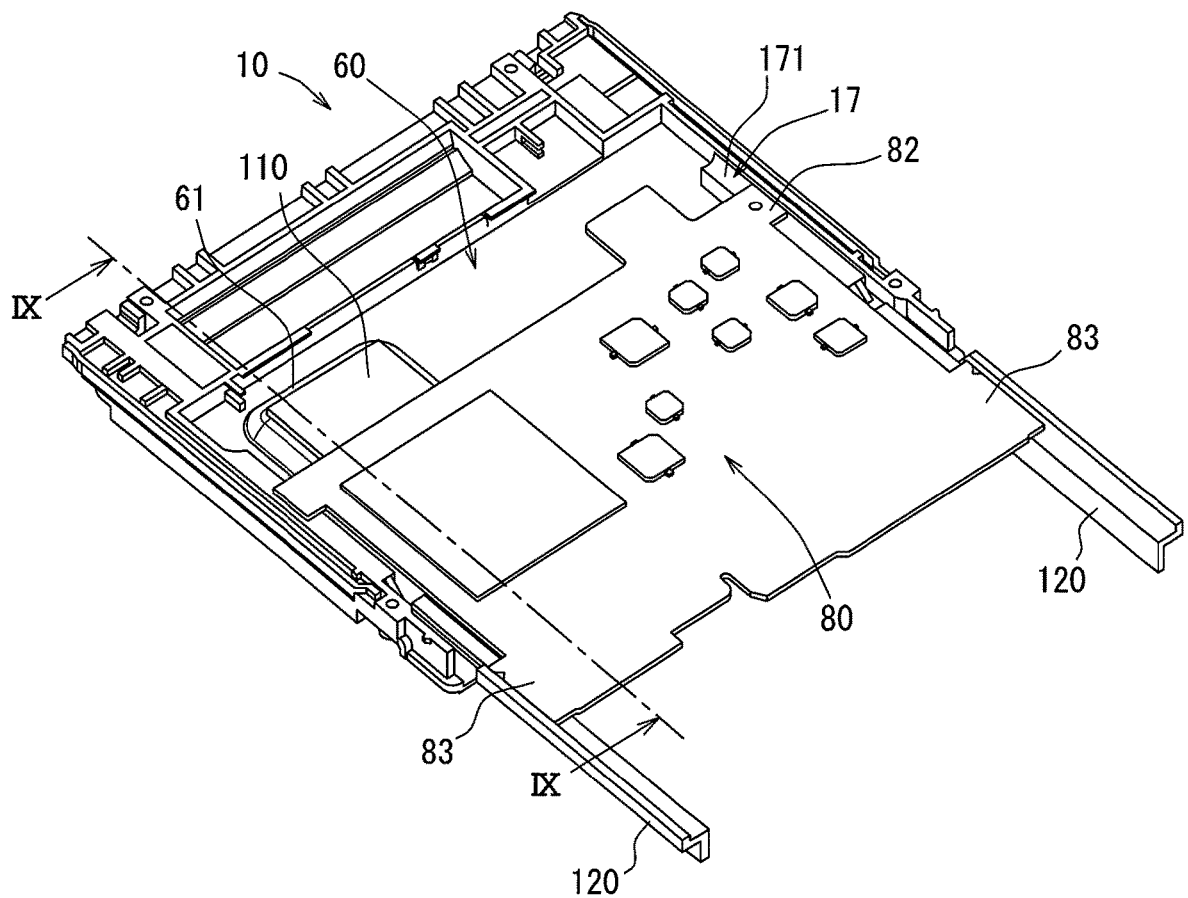
FIG. 8 is a view showing a state when the mounted circuit board 20 is inserted in the case 10.

FIG. 8 shows a state where the mounted circuit board 20 is inserted in the case 10. FIG. 8 is a cross sectional view showing the case 10 taken along the same surface as that in FIG. 4.

As shown in FIG. 8, a heat radiation seat 110 is fixed to an inner surface of the radiation lid 60. The heat radiation seat 110 corresponds to a heat conduction member. The heat radiation seat 110 is adhered to a flat top of the frustum 61 in the inner surface of the radiation lid 60. Conveying rails 120 shown in FIG. 8 are components to carry the opening projected parts 83 of the circuit board 80, respectively. The opening projected parts 83 of the circuit board 80 enable the circuit board 80 to be mounted on the conveying rails 120, respectively, without causing the conveying rails 120 to make contact with the electronic components 90 in the circuit board 80.

Figure 9:
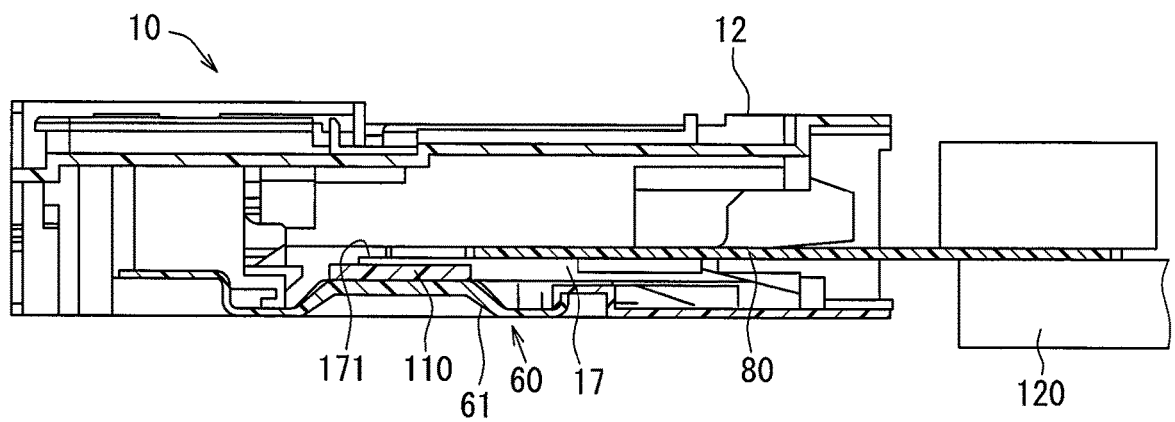
FIG. 9 is a sectional view taken along a line IX-XI of FIG. 8.

FIG. 9 is a sectional view taken along a line IX-IX in FIG. 8. As shown in FIG. 9, in a state where the circuit board 80 is supported by the supporting surfaces 171 of the guiderails 17 and is moved backward in the case 10, a clearance exists between rear side of the circuit board 80 and the heat radiation seat 110. This is because the supporting surfaces 171 of the guiderails 17 are closer to the upper surface 12 of the case 10 than an upper surface of the heat radiation seat 110.

Figure 10:
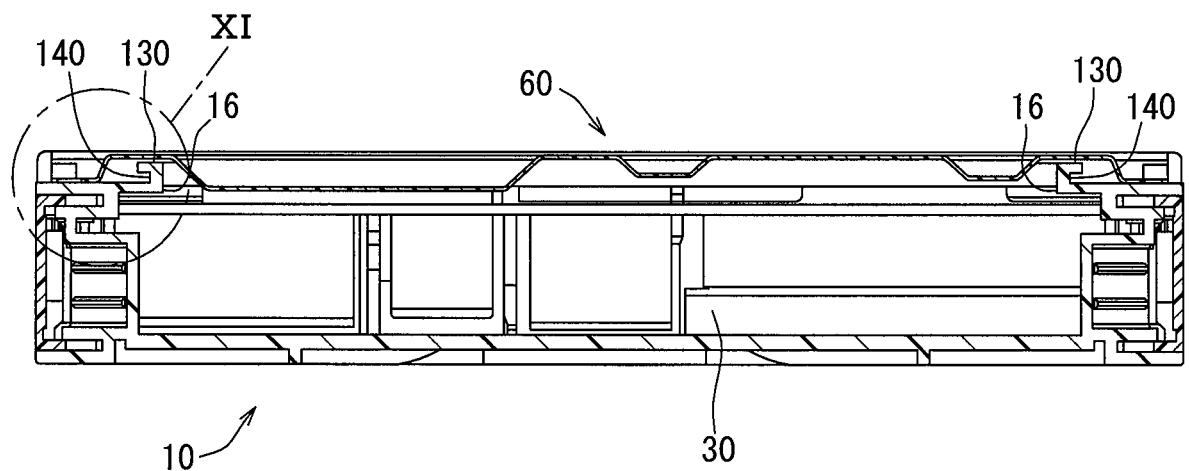
FIG. 10 is a sectional view taken along a line X-X of FIG. 2.

FIG. 10 is a sectional view taken along a line X-X in FIG. 2. A vertical wall 140 is provided around the opening 16 on the case 10. The vertical wall 140 extends in a direction away from the case 10, that is, extends in a vertical direction to the outside of the case 10. The flange 130 includes a tip which extends from its base part connecting to the vertical wall 140 in the direction away from the opening 16 along the case 10.

FIG. 11 is an enlarged view showing a portion around the vertical wall 140 in FIG. 10. A water passage 150 is formed as surrounded by a basal part 19 of the case 10, the vertical wall 140, and the flange 130. As described above, the upper surface 12 and the lower surface 14 of the electronic device 1 are fixed to incline relative to the horizontal plane. Therefore the water passage 150 inclines relative to a horizontal plane.

As shown in FIG. 11, the radiation lid 60 which includes the drawn part 62 in the loop shape without a cut closes the opening 16. The configuration restrains water from entering into the case 10 from the opening 16. If a gap arises between the radiation lid 60 and the case 10, and if water flows toward the opening 16 through the gap, the vertical wall 140 and the flange 130 restrain water from entering into the case 10 through the opening 16. Furthermore, the configuration that the water passage 150 inclines relative to the horizontal plane enables water which flows to the opening 16 to flow along the water passage 150 and to be discharged.

A conclusion of the present embodiment will be described below. A manufacturing process in which the mounted circuit board 20 is mounted on the case 10 of the electronic device 1 having the above-described configuration will be described as below.

When the mounted circuit board 20 is mounted on the case 10, the case 10 is placed such that the heat radiation seat 110 is located on the lower side than the circuit board 80. Subsequently, the mounted circuit board 20 is inserted into the case 10 from the circuit board insertion slot 11 in the state where the opening projected parts 83 of the circuit board 80 are placed on the conveying rails 120, respectively. The backside projected part 82 of the circuit board 80 is supported by the supporting surfaces 171 of the guiderails 17, respectively, thereby to stabilize the mounted circuit board 20. In this state, the mounted circuit board 20 is slid thereby to move the mounted circuit board 20 in the back direction of the case 10.

As shown in FIG. 9, the supporting surfaces 171 of the guiderails 17 are placed at the positions such that the clearance exists between the case-backside end of the circuit board 80 and the heat radiation seat 110 in a direction perpendicular to the circuit board 80 when the circuit board 80 is supported by the supporting surfaces 171. Therefore, this configuration restrains the heat radiation seat 110 from peeling, due to that the case-backside end of the circuit board 80 pushes the side of the heat radiation seat 110 or rubs the heat radiation seat 110 when the mounted circuit board 20 is slid.

When the mounted circuit board 20 is inserted to a position in which the backside projected part 82 is unable to be supported by the guiderail 17, the circuit board 80 is moved downward by gravity toward the deep side of the case 10. When the case-backside end surface of the circuit board 80 is abutted to the slope 1012 of the surface rib 101, the case-backside end surface of the circuit board 80 is moved downward along the slope 1012 of the surface rib 101.

A vertical position of the circuit board 80 which has been moved downward along the slope 1012 of the surface rib 101 is fixed by contacting the circuit board positioning base level 1022. In this state, when the mounted circuit board 20 is moved further toward the case backside, the case-backside end of the circuit board 80 is pressed by the pinching part 100. Therefore the mounted circuit board 20 is fixed to the case 10. When the circuit board 80 is located at the position, a part of the circuit board 80 in which the heat generating part 91 is provided to the back side of the circuit board 80 is brought into contact to the heat radiation seat 110. Therefore, reduction in the heat dissipation can be restrained by causing the part of the mounted circuit board 20 in which the heat generating part 91 is mounted to make contact to the heat radiation seat 110.

When the insertion slot lid 30 is attached to the circuit board insertion slot 11, the circuit board 80 is pressed toward the case backside by the pressing part 31 of the insertion slot lid 30. Therefore, the mounted circuit board 20 is fixed more solidly with the case 10.

This present disclosure also includes combinations and structures, one or more or less of combination or configuration.

A variation 1 will be described as follows. In the previous embodiment, the circuit board positioning base level 1022, which corresponds to the circuit board positioning base point, is in surface-contact to the circuit board 80. However, the circuit board positioning base point may be in line-contact to the circuit board 80.

A variation 2 will be described as follows. In the previous embodiment, the heat radiation seat 110 is shown as the heat conduction member. It is noted that, the heat conduction member made of a heat conductive material suffices. The heat conduction member may have a configuration made of a heat radiation gel or the like other than the heat radiation seat 110.

A variation 3 will be described as follows. In the above-described embodiment, K5 which is the length of the opening projected part 83 of the circuit board 80 along the direction of the guiderail 17 is shorter than G4 which is the distance from the end of the circuit board 80 on the side of the circuit board insertion slot 11 to the end of the guiderail 17 on the side of the circuit board insertion slot 11.

However, in a case where G1 which is the distance between the pair of the guiderails 17 and 17 is set longer than the width of the circuit board 80 in which the opening projected parts 83 are provided, G4 which is the distance from the end of the circuit board 80 on the side of the circuit board insertion slot 11 to the end of the guiderail 17 on the side of the circuit board insertion slot 11 may be set shorter.

In a case where G4 is set shorter than that in the above-described embodiment, the guiderail 17 may be overlapped with the opening projected part 83 of the circuit board 80 in the direction of the circuit board insertion. However, in the case where G1 which is the distance between the pair of the guiderails 17 and 17 is set longer than the width of the circuit board 80 in which the opening projected parts 83 are provided, the circuit board 80 is enabled to be housed to the case 10 without a contact between the opening projected parts 83 and the guiderails 17.

The present disclosure is not limited to the above embodiments and/or modifications but can be further modified in various manners without departing from a spirit of the present disclosure. The present disclosure is not limited by the embodiments or structure. The present disclosure also includes various combinations and structures of the embodiments and other combinations and configurations including only one element of the embodiments, more of the elements of the embodiments, and less of the elements of the embodiments.

The invention claimed is:

1. An electronic device comprising:
    a mounted circuit board including a circuit board and a heat generating part mounted on the circuit board;
    a case including a substrate insertion slot which enables insertion of the mounted circuit board therethrough and housing the mounted circuit board; and,
    a heat conduction member fixed in the case and in contact to a part of the mounted circuit board on which the heat generating part is mounted and made of a heat conductive material, wherein
    the case includes
        a pair of guiderails that is to support sides of the mounted circuit board, respectively, and guides the mounted circuit board backward in the case when the mounted circuit board is inserted from the circuit board insertion slot; and
    the circuit board includes
        a component mounting part that has a width shorter than a distance between the pair of guiderails and on which an electronic component is mounted, and
        a pair of backside projected parts that protrudes in a width direction from the component mounting part at case-backside ends of the circuit board, respectively, wherein
    a width K2 which is a sum of a width of the component mounting part and widths of the backside projected parts, is between a distance G1 and a distance G2,
    the distance G1 is a length between the pair of the guiderails, and
    the distance G2 is a length which is a sum of the distance between the pair of the guiderails and the widths of the guiderails in the width direction,
    the pair of guiderails has supporting surfaces, respectively, that is to support the circuit board and placed at positions such that a clearance is formed between a case-backside end of the circuit board and the heat conduction member in a direction perpendicular to the circuit board when the circuit board is supported by the supporting surfaces,
    a distance G3 from the circuit board insertion slot to an end of the guiderail on the side of the case backside, is shorter than a distance K4 from an end of the circuit board on the side of the circuit board insertion slot to an end of each of the backside projected parts on the side of the circuit board insertion slot.

2. The electronic device according to claim 1, further comprising:
    a pinching part that pinches the case-backside end of the circuit board in a state where the case houses the mounted circuit board and restrains the mounted circuit board from moving relative to the case.

3. The electronic device according to claim 2, wherein
    the pinching part includes a pair of contact portions in contact to the front side and the rear side of the circuit board, respectively, and
    a circuit board positioning base part extends from one of the contact portions which is located farther from the guiderail in a vertical direction of the circuit board and positions the circuit board in the vertical direction by being in contact with the circuit board.

4. The electronic device according to claim 1, wherein
    the circuit board includes a pair of opening projected parts which protrudes from the component mounting part in the width direction on the side of the circuit board insertion slot, and
    a distance G4 from the end of the circuit board on the side of the circuit board insertion slot to the end of the guiderail on the side of the circuit board insertion slot is longer than a length K5 of the opening projected part along the direction of the guiderail.

5. The electronic device according to claim 1, further comprising:
    an insertion slot lid configured to be attached to the circuit board insertion slot of the case, wherein
    the insertion slot lid includes a pressing part which presses a surface of the circuit board on the side of the circuit board insertion slot in a state where the insertion slot lid is attached to the case.

6. The electronic device according to claim 1, wherein
    the case is made of a resin and includes an opening which is opposed to the mounted circuit board,
    the electronic device further comprising:
    a radiation lid to which the heat conduction member is fixed and that closes the opening, wherein
    the radiation lid is made of metal,
    the case includes a vertical wall and a flange,
    the vertical wall is provided around the opening and includes a tip which extends in a direction away from the case, and
    the flange is connected to the vertical wall and includes a tip which extends along the case in a direction away from the opening.

7. The electronic device according to claim 6, wherein
    the radiation lid includes a radiation lid main part and a radiator peripheral edge part, the heat conduction member is fixed to the radiation lid main part, the radiator peripheral edge part is formed in a loop shape on the periphery of the radiation lid and connected to the radiation lid main part, and the radiator peripheral edge part is in contacted to the case around the opening and surrounds the opening.

\* \* \* \* \*